(12) United States Patent
Kotte et al.

(10) Patent No.: US 10,095,626 B2
(45) Date of Patent: Oct. 9, 2018

(54) MULTIBIT NAND MEDIA USING PSEUDO-SLC CACHING TECHNIQUE

(71) Applicant: Toshiba Memory Corporation, Minato-ku, Tokyo (JP)

(72) Inventors: Narasimhulu Dharani Kotte, Fremont, CA (US); Senthil Thamgaraj, Fremont, CA (US); Robert Reed, El Dorado Hills, CA (US); Hitoshi Kondo, San Jose, CA (US)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/456,346

(22) Filed: Mar. 10, 2017

(65) Prior Publication Data
US 2018/0260331 A1 Sep. 13, 2018

(51) Int. Cl.
G06F 12/00 (2006.01)
G06F 12/0873 (2016.01)
G06F 11/10 (2006.01)
G11C 29/52 (2006.01)
G06F 12/0868 (2016.01)

(52) U.S. Cl.
CPC ...... *G06F 12/0873* (2013.01); *G06F 11/1068* (2013.01); *G06F 12/0868* (2013.01); *G11C 29/52* (2013.01); *G06F 2212/1016* (2013.01); *G06F 2212/214* (2013.01); *G06F 2212/222* (2013.01); *G06F 2212/283* (2013.01); *G06F 2212/305* (2013.01); *G06F 2212/313* (2013.01); *G06F 2212/7206* (2013.01)

(58) Field of Classification Search
CPC ............... G06F 11/108; G06F 11/1068; G06F 11/1072; G06F 12/0873; G06F 12/0868; G06F 12/0246
See application file for complete search history.

(56) References Cited

U.S. PATENT DOCUMENTS

| | | | |
|---|---|---|---|
| 7,953,931 B2 | 5/2011 | Yu et al. |
| 8,144,505 B2 | 3/2012 | Lee |
| 8,225,067 B2 | 7/2012 | Chu et al. |
| 8,407,191 B1 | 3/2013 | Nanda |

(Continued)

OTHER PUBLICATIONS

San Disk Ultra II SSD review: A new level of SSD afforadability by Dong Ngo, Reviewed: Sep. 22, 2014 (https://www.cnet.com/products/sandisk-ultra-ii-ssd/review).

(Continued)

*Primary Examiner* — Shelly A Chase
(74) *Attorney, Agent, or Firm* — White & Case LLP

(57) ABSTRACT

A solid state drive (SSD) with pseudo-single-level cell (pSLC) caching and a method of caching data in an SSD is disclosed. In one embodiment, the SSD includes a plurality of multibit NAND media devices arranged in one or more channels communicatively coupled to a memory controller. A first portion of the plurality of multibit NAND media devices is configured to operate as a pSLC cache and a second portion of the plurality of multibit NAND media devices is configured to operate as a multibit NAND media storage area. In one embodiment, the pSLC cache comprises a first area for a pSLC write cache and a second area for a pSLC read cache.

20 Claims, 9 Drawing Sheets

(56) References Cited

U.S. PATENT DOCUMENTS

| | | | |
|---|---|---|---|
| 8,725,932 B2 * | 5/2014 | Yano | G06F 11/1441 |
| | | | 707/682 |
| 8,825,941 B2 | 9/2014 | Moshayedi et al. | |
| 8,886,990 B2 | 11/2014 | Meir et al. | |
| 8,954,654 B2 | 2/2015 | Yu et al. | |
| 9,037,776 B2 | 5/2015 | Yu | |
| 9,123,422 B2 | 9/2015 | Yu et al. | |
| 9,195,604 B2 | 11/2015 | Nemazie et al. | |
| 9,298,603 B2 | 3/2016 | Schuette | |
| 9,405,621 B2 | 8/2016 | Yu et al. | |
| 9,496,043 B1 | 11/2016 | Camp et al. | |
| 2013/0138870 A1 | 5/2013 | Yoon et al. | |
| 2014/0003142 A1 | 1/2014 | Lee et al. | |
| 2014/0133226 A1 | 5/2014 | Marotta et al. | |
| 2014/0219020 A1 * | 8/2014 | Kwak | G11C 16/10 |
| | | | 365/185.03 |
| 2015/0120988 A1 | 4/2015 | Hung et al. | |
| 2015/0149693 A1 | 5/2015 | Ng et al. | |
| 2015/0205664 A1 | 7/2015 | Janik et al. | |
| 2015/0220433 A1 * | 8/2015 | Schmidberger | G06F 12/0246 |
| | | | 711/103 |
| 2015/0262714 A1 | 9/2015 | Tuers et al. | |
| 2016/0041762 A1 | 2/2016 | Kanno et al. | |
| 2016/0225461 A1 | 8/2016 | Tuers et al. | |
| 2016/0284393 A1 | 9/2016 | Ramalingam | |

OTHER PUBLICATIONS

Joe Chang, "SSD and Internal SQL Server Tuning Strategies", 1 page, published Sep. 9, 2013.

* cited by examiner

MULTIBIT NAND MEDIA USING PSEUDO-SLC CACHING TECHNIQUE

FIELD OF THE INVENTION

This invention is generally related to caching techniques for a solid state drive (SSD).

BACKGROUND OF THE INVENTION

SSDs typically include flash-based memory media, such as NAND media, a flash memory controller, and a memory buffer, such as DRAM and/or SRAM. The NAND media can be a single-level cell (SLC) media storing one bit of memory data per cell, or the NAND media can be multibit NAND media, such as multi-level cell (MLC) media and triple-level cell (TLC) media storing two bits of memory data per cell and three bits of memory data per cell, respectively. The need for higher capacity SSDs capable of storing hundreds to thousands of terabytes (TBs) of data or more drives the increasing development and adoption of multibit NAND media. To achieve this level of storage capacity, NAND media with increasing storage density is required. Development of the next-generation of multibit NAND media, quad-level cell (QLC) media, capable of storing four bits of memory data per cell is ongoing, and it is foreseeable that flash-based memory media capable of storing an even greater number of bits of memory data per cell will be developed in the future.

The use of increasingly dense multibit NAND media presents a number of issues. For example, it is well known that TLC NAND media is more prone to read errors than MLC NAND media, which in turn is more prone to read errors than SLC NAND media. So when a host sends data to be written to the SSD, the data will be first buffered in the DRAM and/or SRAM to undergo error correction parity encoding before it can be written to the TLC NAND media. Error correction parity encoding of the data slows the performance of the SSD because it is very time consuming.

Because TLC NAND media is more prone to read errors, it also has higher error correction requirements. For example, a low-density parity check (LDPC) error correction scheme may be able to support up to 120 bit-flips per one kilobyte (KB) of data read from the TLC NAND media, whereas a Bose-Chaudhuri-Hocquenghem (BCH) error correction scheme may be able to support up to 120 bit-flips per 2 KB of data read from the TLC NAND media. In the case of BCH error correcting code (ECC) with TLC NAND media, the SSD's ECC engine would likely not be able to properly correct data read from the TLC NAND media on a fairly regular basis (i.e. the BCH ECC capability is exceeded), and a more robust ECC mechanism is required, such as Quadruple Swing-By Code (QSBC) developed by Toshiba which has ten times the error correction capability of typical BCH ECC. The tradeoff, however, is that more robust ECC mechanisms such as QSBC also take longer to perform (measured in milliseconds (ms) as compared to less robust mechanisms such as BCH which are measured in microseconds ($\mu s$)).

Finally, due to the storage density and programming requirements of TLC NAND media, writing data to and reading data from TLC NAND media also takes longer to perform as compared to SLC and MLC NAND media. Thus, typical SSDs using TLC NAND media will have substantially reduced input/output operations per second (IOPs) as compared to SSDs using SLC NAND media. Further, for next-generation multibit NAND media, such as QLC NAND media and beyond, a further reduction in performance will be likely given the probable proportional increase in read errors necessitating more frequent use of robust ECC mechanisms and proportional decrease in IOPs due to increasing storage density.

There is, therefore, an unmet demand for SSDs addressing the performance and host-read error issues with multibit NAND media.

BRIEF DESCRIPTION OF THE INVENTION

In one embodiment, an SSD includes a memory controller, a plurality of multibit NAND devices arranged in one or more channels communicatively coupled to the memory controller, one or more volatile memory devices communicatively coupled to the memory controller, and a host interface communicatively coupled to the memory controller. In one embodiment, a first portion of the plurality of multibit NAND media devices is configured to operate as a pseudo-SLC (pSLC) cache, and a second portion of the multibit NAND media devices is configured to operate as a multibit NAND media storage area. In one embodiment, the plurality of multibit NAND media devices are MLC NAND media devices. In another embodiment, the plurality of multibit NAND media devices are TLC NAND media devices. In yet another embodiment, the plurality of multibit NAND media devices are QLC NAND media devices.

In one embodiment, the memory controller is configured to write data received via the host interface to one or more blocks of the pSLC cache. In one embodiment, the memory controller is configured to transfer data from the one or more blocks of the pSLC cache to one or more blocks of the multibit NAND media storage area. The memory controller is further configured to read the data transferred to the multibit NAND media storage area and determine if an ECC error correction threshold has been exceeded for the data read, and if so, write the data exceeding the ECC error correction threshold back to the pSLC cache. In one embodiment, the memory controller is further configured to mark blocks of the multibit NAND media storage area exceeding the ECC error correction threshold as bad blocks. The memory controller is configured to write data to the bad blocks only when all other blocks of the multibit NAND media storage area that have not been marked as bad blocks have been occupied with data.

In one embodiment, the memory controller is further configured to sequentially write the data contained in the one or more blocks of the pSLC cache to one or more blocks of the multibit NAND media storage area. In one embodiment, the memory controller is configured to perform an in-memory sorting within the one or more volatile memory devices of at least one set of logical block addresses (LBAs) and a set of logical cluster addresses (LCAs) corresponding to the data contained in the one or more blocks of the pSLC cache to be written to one or more blocks of the multibit NAND media storage area.

In one embodiment, the pSLC cache includes a first area for a pSLC write cache and a second area for a pSLC read cache. In one embodiment, the memory controller is configured to write data received via the host interface to one or more blocks of the pSLC write cache. The memory controller is further configured to transfer data from the pSLC write cache to the multibit NAND media storage area, and for the data transferred to the multibit NAND media storage area exceeding the ECC error correction threshold, the memory controller is configured to write such data to the pSLC read cache when the pSLC read cache is not full, and to write such data to the pSLC write cache when the pSLC read cache is full. In one embodiment, the memory controller is further configured to write data contained in the one or more blocks of the pSLC write cache to the multibit NAND media storage after a write threshold of the pSLC write cache has been exceeded.

In one embodiment, the storage capacity of the pSLC cache is a sum of an initial storage capacity and a series of iterative storage capacities. The initial storage capacity is equal to a result of dividing a storage capacity that remains when a specified user data storage capacity and an overprovisioning (OP) storage capacity are subtracted from a total storage capacity of the plurality of multibit NAND media devices by a storage density of the multibit NAND media devices. A first iterative storage of the series of iterative storage capacities is equal to the initial storage capacity divided by the storage density of the multibit NAND media devices, and each subsequent iterative storage capacity of the series of iterative storage capacities is equal to an immediately preceding storage capacity divided by the storage density of the multibit NAND media devices. A last iterative storage capacity of the series of iterative storage capacities is less than a write flush threshold value.

In one embodiment, a storage capacity of the pSLC write cache is equal to a result of multiplying a specified number of drive writes per day (N-DWPD) of the multibit NAND media devices, a specified number of years of operation of the multibit NAND media devices, 365 days, and a specified user data storage capacity, and dividing the result by a specified number of program/erase (PE) cycles of a block of the multibit NAND media devices. A storage capacity of the pSLC read cache is equal to a difference of a storage capacity of the pSLC cache and the storage capacity of the pSLC write cache.

In one embodiment, the memory controller is further configured to collect host read statistics for each one of the one or more blocks of the pSLC read cache and multibit NAND media storage area. In one embodiment, the memory controller is further configured to perform an eviction process when the pSLC read cache is full. The eviction process includes the memory controller identifying one or more blocks of the multibit NAND media storage area that have a greater number of host reads than one or more blocks of the pSLC read cache and swapping data contained in the one or more blocks of the multibit NAND media storage area having the greater number of host reads with data contained in the one or more blocks of the pSLC read cache having a fewer number of host reads.

In one embodiment, a method of caching data in an SSD having a plurality of multibit NAND media devices includes configuring a first portion of the plurality of multibit NAND media devices to operate as a pSLC cache and configuring a second portion of the plurality of multibit NAND media devices to operate as a multibit NAND storage area. In one embodiment, the plurality of multibit NAND media devices are MLC NAND media devices. In another embodiment, the plurality of multibit NAND media devices are TLC NAND media devices. In yet another embodiment, the plurality of multibit NAND media devices are QLC NAND media devices.

In one embodiment, the method further includes receiving data from a host device connected to the SSD and writing the data to one or more blocks of the pSLC cache. In one embodiment, the method further includes transferring data from the one or more blocks of the pSLC cache to one or more blocks of the multibit NAND media storage area and reading the data transferred to the multibit NAND media storage area. In one embodiment, the method further includes determining if an ECC error correction threshold has been exceeded for the data read, and for the data read exceeding the ECC error correction threshold, writing such data to the pSLC cache. In one embodiment, the method further includes marking blocks of the multibit NAND media storage area exceeding the ECC error correction threshold as bad blocks and writing data to the bad blocks when all other blocks of the multibit NAND media storage area that have not been marked as bad blocks have been occupied with data.

In one embodiment, the method further includes sequentially writing data contained in the one or more blocks of the pSLC cache to one or more blocks of the multibit NAND media storage area. In one embodiment, the step of sequentially writing data to the one or more blocks of the multibit NAND media storage area includes sorting, in a volatile memory communicatively coupled to the plurality of multibit NAND media devices, at least one of a set of LBAs and a set of LCAs corresponding to the data contained in the one or more blocks of the pSLC cache before writing the data to one or more blocks of the multibit NAND media storage area.

In one embodiment, the method further includes configuring the pSLC cache into a pSLC write cache and a pSLC read cache and writing data received from the host device to one or more blocks of the pSLC write cache. The method further includes transferring the data contained in the one or more blocks of the pSLC cache to the multibit NAND media storage area, and for the data transferred to the multibit NAND media storage area exceeding the ECC error correction threshold, writing such data to the pSLC read cache when the pSLC read cache is not full, and writing such data to the pSLC write cache when the pSLC read cache is full. In one embodiment, the method further includes writing data contained in the one or more blocks of the pSLC write cache to the multibit NAND media storage area after a write threshold of the pSLC write cache has been exceeded.

In one embodiment, the step of configuring the portion of the plurality of multibit NAND media devices to operate as a pSLC cache includes calculating a storage capacity of the pSLC cache that is a sum of an initial storage capacity and a series of iterative storage capacities. In one embodiment, the storage capacity of the pSLC cache is a sum of an initial storage capacity and a series of iterative storage capacities. The initial storage capacity is equal to a result of dividing a storage capacity that remains when a specified user data storage capacity and an OP storage capacity are subtracted from a total storage capacity of the plurality of multibit NAND media devices by a storage density of the multibit NAND media devices. A first iterative storage of the series of iterative storage capacities is equal to the initial storage capacity divided by the storage density of the multibit NAND media devices, and each subsequent iterative storage capacity of the series of iterative storage capacities is equal to an immediately preceding storage capacity divided by the storage density of the multibit NAND media devices. A last iterative storage capacity of the series of iterative storage capacities is less than a write flush threshold value.

In one embodiment, the step of configuring the pSLC cache into the pSLC write cache and the pSLC read cache includes calculating a storage capacity of the pSLC write cache and a storage capacity of the pSLC read cache. In one embodiment, a storage capacity of the pSLC write cache is equal to a result of multiplying a specified N-DWPD of the multibit NAND media devices, a specified number of years of operation of the multibit NAND media devices, 365 days, and a specified user data storage capacity, and dividing the result by a specified number of PE cycles of a block of the multibit NAND media devices. A storage capacity of the pSLC read cache is equal to a difference of a storage capacity of the pSLC cache and the storage capacity of the pSLC write cache.

In one embodiment, the method further includes collecting host read statistics for each one of the one or more blocks of the pSLC read cache and the multibit NAND media storage area, and performing an eviction process when the pSLC read cache is full. In one embodiment, the eviction process includes identifying one or more blocks of the multibit NAND media storage area that have a greater number of host reads than one or more blocks of the pSLC read cache, and swapping data contained in the one or more blocks of the multibit NAND media storage area having the greater number of host reads with data contained in the one or more blocks of the pSLC read cache having a fewer number of host reads.

DETAILED DESCRIPTION OF THE INVENTION

Figure 1:
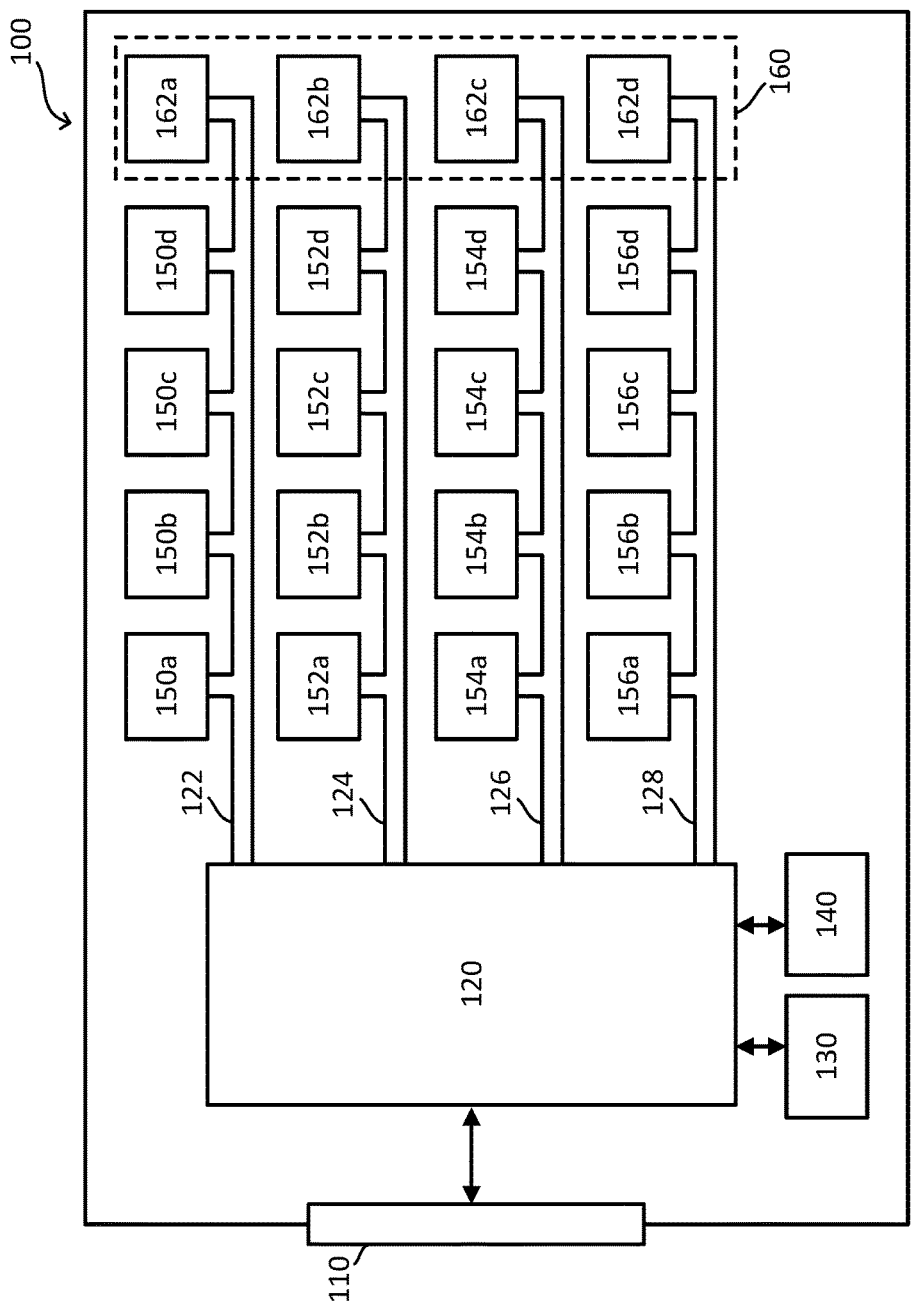
FIG. 1 is a block diagram of an SSD with pSLC caching, according to one embodiment of the invention.

FIG. 1 is a block diagram of an SSD 100 with pSLC caching, according to one embodiment of the invention. As shown in FIG. 1, SSD 100 has a host interface 110 that allows the SSD 100 to be connected to a host device (not shown). The host device may be any suitable device, such as a computer or a storage appliance. The host interface 110 may be any suitable interface that facilitates communication between the SSD 100 and the host device, such as a Peripheral Component Interconnect Express™ (PCIe or PCI Express) interface, a Serial ATA™ (SATA) interface, Serial Attached SCSI™ (SAS), etc.

The SSD 100 includes a memory controller 120 in communication with a DRAM 130, an SRAM 140, and an array of multibit NAND media devices 150a-d, 152a-d, 154a-d, 156a-d, and 162a-d. The memory controller 120 manages the writing, reading, and erasing of data stored on the multibit NAND media of the SSD 100, and facilitates communication with the host device. In one embodiment, the firmware of the memory controller 120 implements the flash translation layer (FTL) to map LBAs of data from the host to physical pages and blocks of the multibit NAND media, and implements garbage collection, error correction, and wear-leveling. The memory controller 120 may use DRAM 130 and SRAM 140 as buffers for storing data and look up tables (LUTs), for performing error correction parity encoding, and the like. The error correction parity encoding may be, for example, Reed Soloman (RS) error correction parity encoding or LDPC error correction parity encoding, etc.

The multibit NAND media devices 150a-d, 152a-d, 154a-d, 156a-d, and 162a-d are arranged in four channels 122, 124, 126, and 128 in communication with the memory controller 120. While twenty multibit NAND media devices (150a-d, 152a-d, 154a-d, 156a-d, and 162a-d) arranged in four channels (122, 124, 126, and 128) are shown in the SSD 100 in FIG. 1, the specific number of multibit NAND media devices and channels are not limited, and may the SSD 100 may include one or more multibit NAND media devices arranged in one or more channels within the scope of the present invention. The number of multibit NAND media devices and channels of such devices in communication with the memory controller 120 within the SSD 100 will depend on the configuration of the SSD 100, including the overall amount of user data storage specified, the storage density and type of multibit NAND media used, and so forth. In one embodiment, the multibit NAND media devices 150a-d, 152a-d, 154a-d, 156a-d, and 162a-d are MLC NAND media devices, or TLC NAND media devices, or QLC NAND media devices, or a combination thereof.

As shown in FIG. 1, the multibit NAND media devices 162a-d serve as additional storage capacity 160 (with one additional multibit NAND media device 162a-d per channel 122, 124, 126, and 128) that is configured as pSLC NAND media to address performance and error issues typically associated with the use of multibit NAND media devices (such as the multibit NAND media devices 150a-d, 152a-d, 154a-d, and 156a-d). For example, for a typical SSD with 1 TB of storage capacity without pSLC caching, 960 GB would be allocated for user data and the remainder, 64 GB, would be allocated as over-provisioning (OP) to act as an additional buffer to assist the memory controller 120 in the management of the NAND media. The amount of OP in a given SSD may vary depending on the SSD's application, but typically is 7% for consumer applications (i.e. 64 GB for 1 TB SSD) and 28% for enterprise applications (i.e. 224 GB for 1 TB SSD).

To meet the same user storage capacity as would be available in a typical 1 TB SSD (i.e. 960 GB) without pSLC caching, the SSD 100 includes 256 GB of additional storage capacity 160 in the form of multibit NAND media devices 162a-d, for a total of 1280 GB of multibit NAND media devices 150a-d, 152a-d, 154a-d, 156a-d, and 162a-d. The multibit NAND media devices 162a-d and a portion of the multibit NAND media devices 150a-d, 152a-d, 154a-d, and 156a-d will form the basis for the pSLC cache for the SSD 100. The calculation and provisioning of the multibit NAND media 150a-d, 152a-d, 154a-d, 156a-d, and 162a-d to form a pSLC cache is shown and described in connection with FIG. 2, below.

Figure 2:
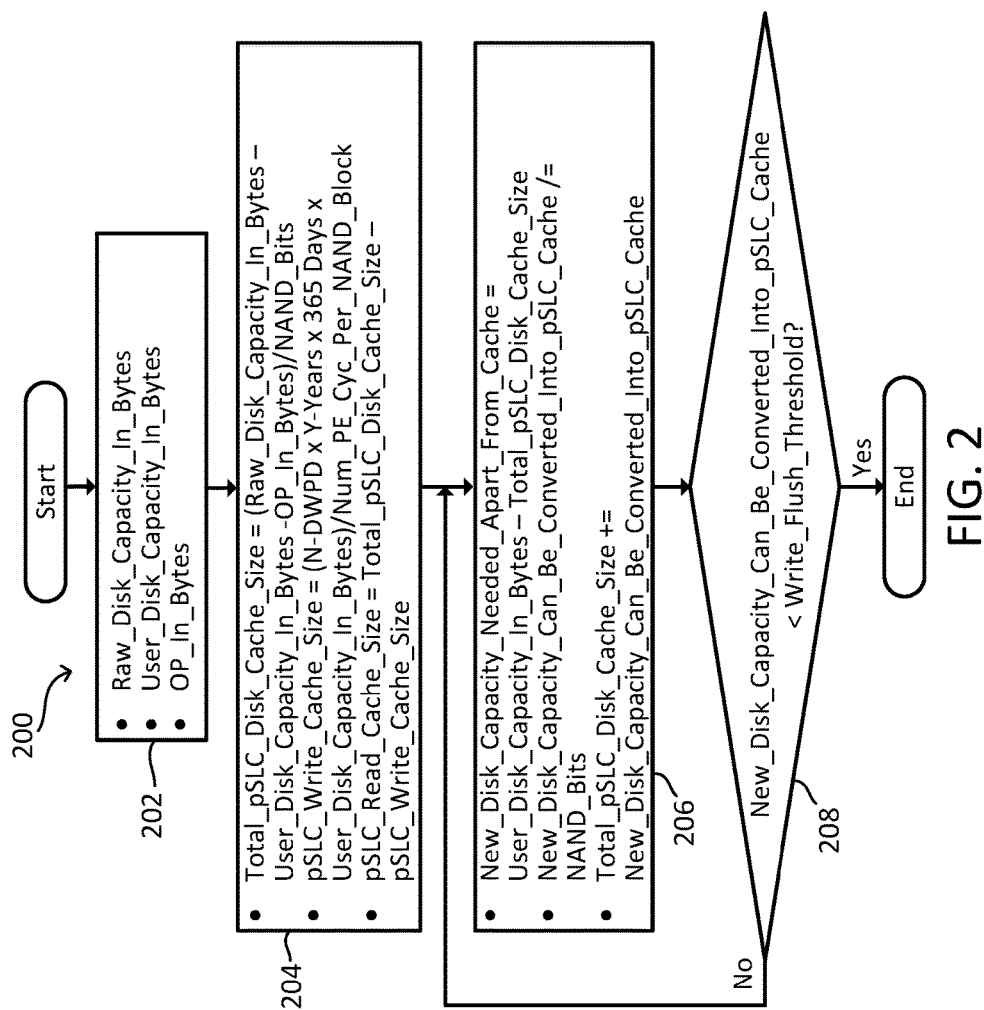
FIG. 2 is a flowchart of steps for calculating a pSLC cache size, according to one embodiment of the invention.

FIG. 2 is a flowchart of steps 200 for calculating a pSLC cache size, according to one embodiment of the invention.

As shown in FIG. 2, the calculation of the pSLC cache size is an iterative process whereby an initial storage capacity of the pSLC cache is determined based on a storage capacity of the additional multibit NAND media devices that are provided for the SSD, and the storage density of the multibit NAND media devices used in the SSD. Subsequent storage capacities may then be added to supplement the pSLC cache based on the remaining total capacity of the SSD (i.e. the storage capacity provided by the multibit NAND media devices and the storage capacity of the pSLC cache). The subsequent storage capacities added to supplement the pSLC cache is determined based on the initial storage capacity of the pSLC cache, the storage density of the multibit NAND devices, and a write flush threshold of the multibit NAND devices. The write flush threshold is a minimum number of pSLC blocks that need be written to one block of the multibit NAND device, and as such, is also based on the storage density of the multibit NAND devices as will be explained in greater detail below.

Referring to FIG. 2, at step 202, the initial configuration of an SSD with pSLC caching, such as the SSD 100 shown and described in FIG. 1, is determined, including the total amount of multibit NAND media contained within an SSD with pSLC caching (Raw_Disk_Capacity_In_Bytes), the desired amount of user storage capacity (User_Disk_Capacity_In_Bytes), and the amount of OP (OP_In_Bytes) specified. As previously discussed, OP is typically 7% for consumer applications and 28% for enterprise applications. At step 204, an initial pSLC cache size (Total_pSLC_Disk_Cache_Size) is determined by subtracting the User_Disk_Capacity_In_Bytes and OP_In_Bytes from the Raw_Disk_Capacity_In_Bytes, and dividing the result by the density of the multibit NAND media (NAND_Bits) used (i.e. 3 for TLC, 4 for QLC, etc.). In other words, the additional multibit NAND media 162a-d of the SSD 100 of FIG. 1 is first allocated to be converted to pSLC cache.

In one embodiment, the pSLC cache is further configured to be divided into a pSLC write cache and a pSLC read cache. The pSLC write cache size (pSLC_Write_Cache_Size) is determined by the endurance requirements of the SSD. As shown at step 204, the pSLC write cache size is calculated by multiplying the specified N-DWPD, how many times the entire capacity of the SSD can be overwritten per day of its usable life without failure during a warranty period, the number of years (Y-Years) of the warranty period, 365 days, and the User_Disk_Capacity_In_Bytes, and dividing the product by the specified number of program/erase (PE) cycles that a NAND block can endure without failure (Num_PE_Cyc_Per_NAND_Block). The pSLC read cache will be the remainder of pSLC_Write_Cache_Size subtracted from the Total_pSLC_Disk_Cache_Size.

At step 206, further multibit NAND media is allocated for the pSLC cache (New_Disk_Capacity_Needed_Apart_From_Cache) by subtracting the Total_pSLC_Disk_Cache_Size from the User_Disc_Capacity_In_Bytes, which is then divided by the density of the multibit NAND media, NAND_Bits, resulting in New_Disk_Capacity_Can_Be_Converted_Into_pSLC_Cache, which is then added to the Total_pSLC_Disk_Cache_Size. In this step, a portion of the multibit NAND media 150a-d, 152a-d, 154a-d, and 156a-d of the SSD 100 of FIG. 1 is allocated to be converted to pSLC cache as well.

At step 208, if the New_Disk_Capacity_Can_Be_Converted_Into_pSLC_Cache is greater than the capacity required for a multibit NAND media write flush (Write_Flush_Threshold), then step 206 is repeated until New_Disk_Capacity_Can_Be_Converted_Into_pSLC_Cache is less than Write_Flush_Threshold, and the pSLC cache size calculation concludes.

Figure 3:
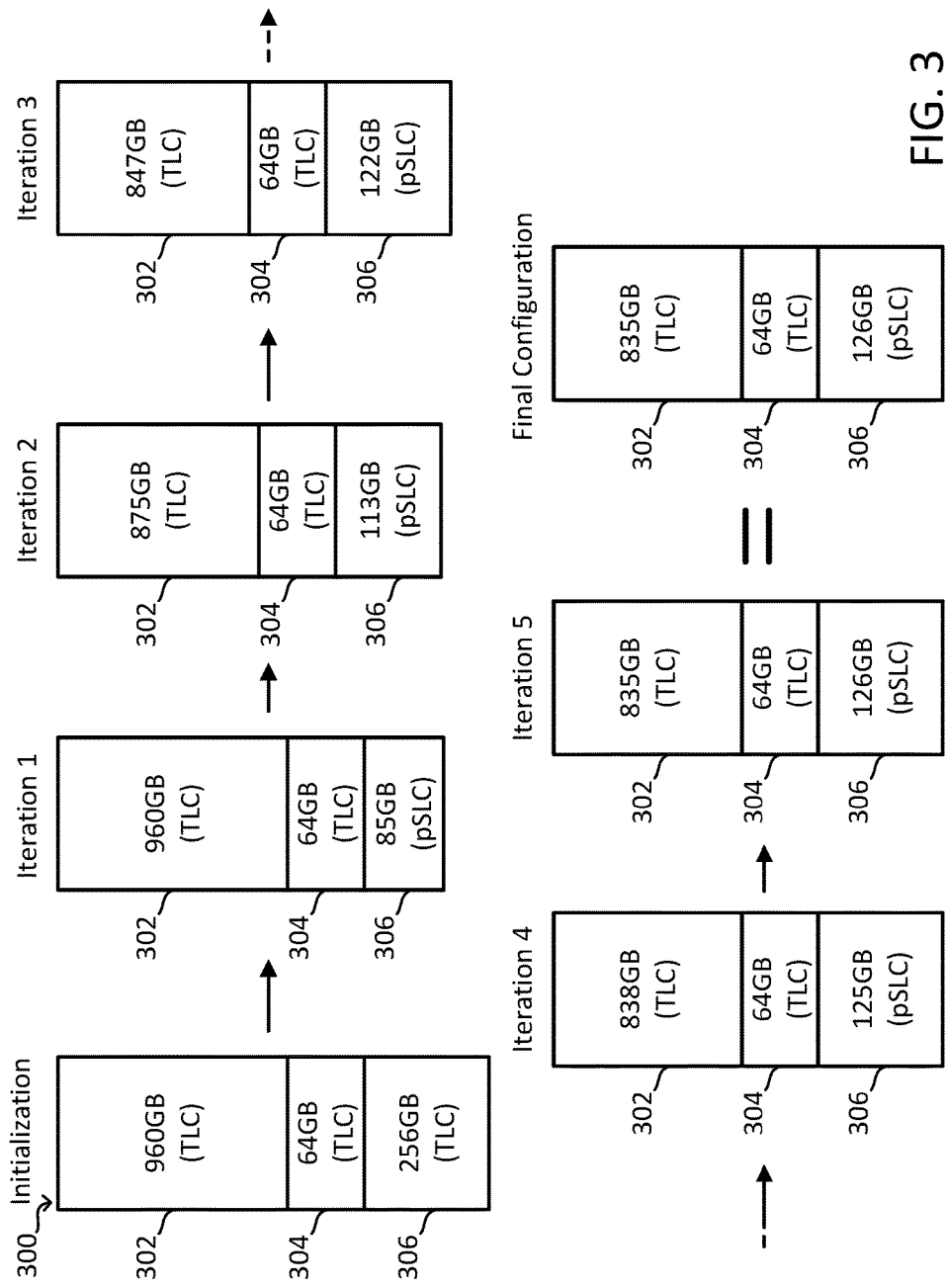
FIG. 3 shows the steps of calculating the pSLC cache size for a given amount of additional TLC NAND media, according to the embodiment of FIG. 2.

FIG. 3 shows the steps of calculating the pSLC cache size for a given amount of additional TLC NAND media, according to the embodiment of FIG. 2. As shown in FIG. 3, initially an SSD 300 has 960 GB of user storage capacity 302 (User_Disk_Capacity_In_Bytes) and 64 GB of OP 304 (7%) (OP_In_Bytes) in the form of TLC NAND media. The SSD 300 also has an additional 256 GB of TLC NAND media 306 added as compared to a typical SSD without pSLC caching, for a total raw capacity of 1280 GB of TLC NAND media for the SSD 300 (Raw_Disk_Capacity_In_Bytes).

In the first iteration of the calculation as described in step 204 of FIG. 2, the additional 256 GB of TLC NAND media 306 is first converted to pSLC cache (i.e. an initial storage capacity of the pSLC cache). Because TLC NAND media has a storage density of three bits per cell, the additional 256 GB of TLC NAND media 306 equates to 85 GB of pSLC cache (Total_pSLC_Disk_Cache_Size (85 GB)=(Raw_Disk_Capacity_In_Bytes (1280 GB)—User_Disk_Capacity_In_Bytes (960 GB)—OP_In_Bytes (64 GB))/NAND_Bits (3)). In other embodiments where MLC or QLC NAND media may be used, for example, NAND_Bits will be two and four, respectively, in those embodiments.

Next, at step 206 of FIG. 2, a portion of TLC NAND media 302, originally allocated to user data, is re-allocated to be converted to pSLC cache 306 (i.e. a first subsequent storage capacity added to supplement the initial storage capacity of the pSLC cache), leaving 875 GB of user storage capacity 302 remaining (New_Disk_Capacity_Needed_Apart_From_Cache (875 GB)=User_Disk_Capacity_In_Bytes (960 GB)—Total_pSLC_Disk_Cache_Size (85 GB)). This adds an additional 28 GB to the pSLC cache 306 (New_Disk_Capacity_Can_Be_Converted_Into_pSLC_Cache (85 GB)/NAND_Bits (3)), bringing it up to 113 GB (Total_pSLC_Disk_Cache_Size (113 GB)=(New_Disk_Capacity_Can_Be_Converted_Into_pSLC_Cache (85 GB)/NAND_Bits (3)+previous Total_pSLC_Disk_Cache_Size (85 GB)). At the second iteration, the New_Disk_Capacity_Can_Be_Converted_Into_pSLC_Cache is 85 GB, which is larger than the Write_Flush_Threshold for TLC NAND media (four), which, as shown in FIG. 2, means that step 206 will be repeated as shown in the third iteration of FIG. 3. In other embodiments where MLC or QLC NAND media may be used, for example, the Write_Flush_Threshold will be three and five, respectively, in those embodiments.

In the third iteration, an additional 28 GB of user storage capacity 302 is allocated to be converted to pSLC cache 306 (i.e. another subsequent storage capacity added to further supplement the initial storage capacity of the pSLC cache), leaving 847 GB of user storage capacity 302 remaining. The additional 28 GB of TLC NAND media is then converted into pSLC cache 306, adding an additional 9 GB to pSLC cache 306, bringing the total pSLC cache 306 to 122 GB. Again, the New_Disk_Capacity_Can_Be_Converted_Into_pSLC_Cache after the third iteration is 28 GB, which is still larger than the Write_Flush_Threshold. In the fourth iteration, an additional 9 GB of TLC NAND media is converted into pSLC cache 306, adding an additional 3 GB to pSLC cache 306, bringing the total pSLC cache s306 to 125 GB and leaving 838 GB of user storage capacity 302 remaining.

Once again, the New_Disk_Capacity_Can_Be_Converted_Into_pSLC_Cache at the fourth iteration is 9 GB, which is still larger than the Write_Flush_Threshold. In the fifth iteration, an additional 3 GB of user storage capacity 302 is allocated to be converted to pSLC cache 306, leaving 835 GB of TLC NAND media 302 remaining. The additional 3 GB of TLC NAND media is then converted into pSLC cache 306, adding an additional 1 GB to pSLC cache 306, bringing the total pSLC cache 306 to 126 GB. At iteration 5, the New_Disk_Capacity_Can_Be_Converted_Into_pSLC_Cache is 3 GB, which is less than the Write_Flush_Threshold and, as such, the pSLC cache size calculation concludes. In the final configuration, the SSD 300 with pSLC caching has a total of 835 GB of user storage capacity 302, 64 GB of OP 304, and 126 GB of pSLC cache 306, for a total of 961 GB of storage.

In one embodiment, the 126 GB of pSLC cache 306 is allocated between a pSLC write cache and a pSLC read cache. As previously described at step 204 in FIG. 2, the size of the pSLC write cache is determined by the endurance requirements of the SSD 300. For example, assuming that the TLC NAND media has a DWPD of three, a requirement of three years of operation, and 50,000 PE cycles, then the pSLC write cache size is about 64 GB ((N-DWPD (3)×Y-Years (3)×365 days×User_Disk_Capacity_In_Bytes (960 GB))/Num_PE_Cyc_Per_Nand_Block (50,000)). The pSLC read cache size will be 62 GB (Total_pSLC_Disk_Cache_Size (126 GB)−pSLC_Write_Cache_Size (64 GB)).

The following tables summarize the pSLC cache sizing of various TLC NAND media based SSDs with typical storage capacities according to various embodiments of the present invention. These tables assume the TLC NAND media has a DWPD of three, requires three years of operation, and have an endurance of 50,000 PE cycles.

TABLE 1

TLC NAND Media Based SSDs with 7% OP

| Raw Capacity (TLC) | TLC Data Capacity | pSLC Read Cache | pSLC Write Cache | User Storage Capacity (TLC + pSLC) | OP (TLC) |
|---|---|---|---|---|---|
| 640 GB | 420 GB | 30 GB | 31 GB | 480 GB | 32 GB |
| 1280 GB | 835 GB | 62 GB | 64 GB | 960 GB | 64 GB |
| 2560 GB | 1670 GB | 124 GB | 126 GB | 1920 GB | 128 GB |
| 5120 GB | 3332 GB | 257 GB | 252 GB | 3840 GB | 256 GB |

TABLE 2

TLC NAND Media Based SSDs with 28% OP

| Raw Capacity (TLC) | TLC Data Capacity | pSLC Read Cache | pSLC Write Cache | User Storage Capacity (TLC + pSLC) | OP (TLC) |
|---|---|---|---|---|---|
| 640 GB | 340 GB | 35 GB | 26 GB | 400 GB | 112 GB |
| 1280 GB | 675 GB | 74 GB | 52 GB | 800 GB | 224 GB |
| 2560 GB | 1348 GB | 147 GB | 105 GB | 1600 GB | 448 GB |
| 5120 GB | 2693 GB | 298 GB | 210 GB | 3200 GB | 896 GB |

Figure 4:
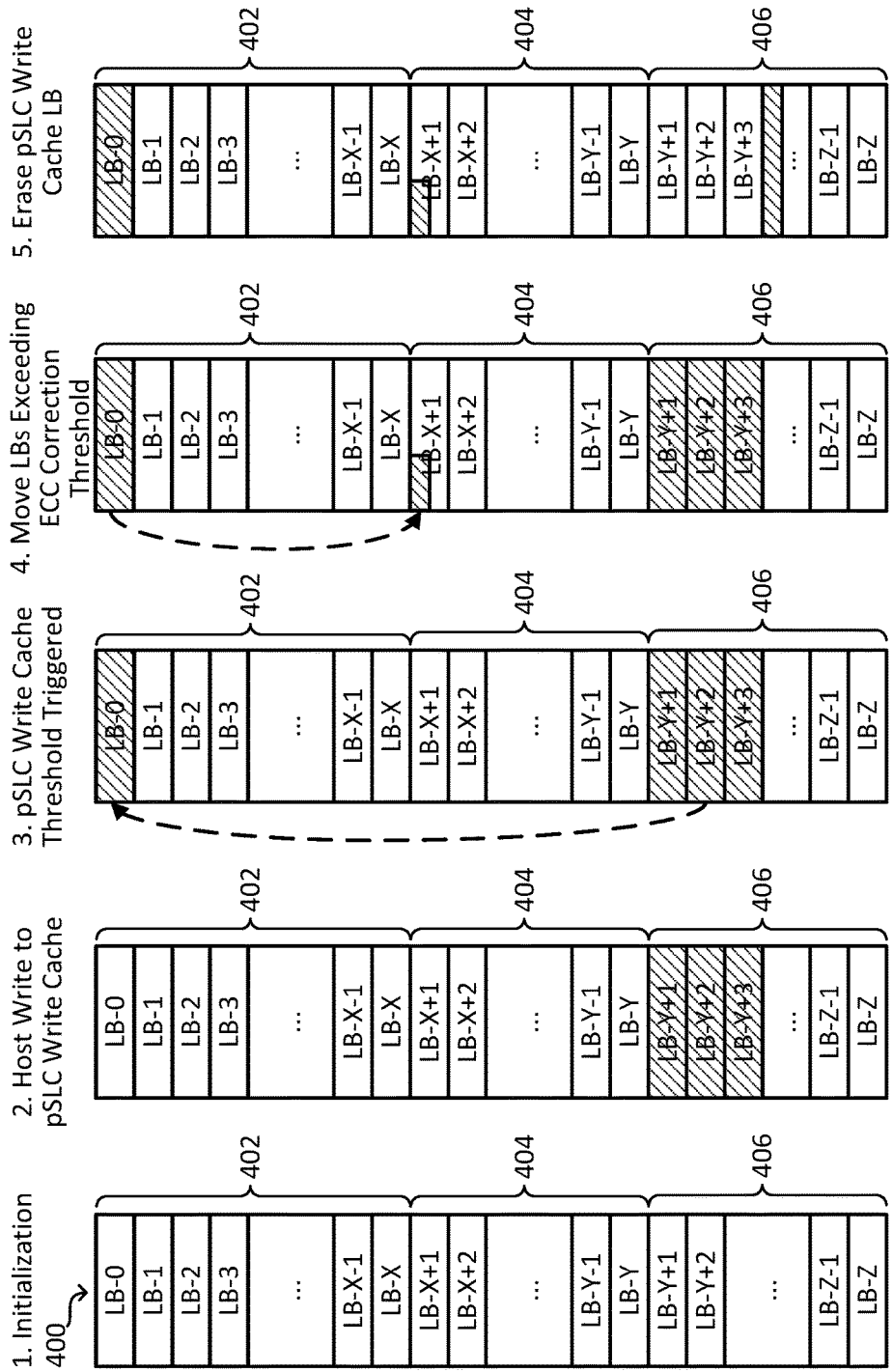
FIG. 4 shows the steps of processing a host write to an SSD with pSLC caching where a pSLC read cache is not full, according to one embodiment of the invention.

FIG. 4 shows the steps of processing a host write to an SSD 400 with pSLC caching when a pSLC read cache 404 is not full, according to one embodiment of the invention. As shown in FIG. 4, the SSD 400 with pSLC caching is initially configured into three different storage areas: (1) a multibit NAND media storage area 402 (logical blocks (LB) LB-0 to LB-X) comprising the multibit NAND media data capacity and the OP following the pSLC cache calculation and provisioning shown and described in FIG. 2; (2) a pSLC read cache 404 (LB-X+1 to LB-Y); and (3) a pSLC write cache 406 (LB-Y+1 to LB-Z). As previously discussed, the pSLC read cache 404 and the pSLC write cache 406 are provisioned multibit NAND media configured to operate as pSLC NAND media according to the pSLC cache calculation shown and described in FIG. 2.

During operation, when the pSLC read cache 404 is not full, a memory controller (not shown) of the SSD 400 writes data received from a host device coupled to the SSD 400 in the physical blocks of the pSLC write cache 406 (denoted by shaded LB's LB-Y+1 to LB-Y+3). In one embodiment, the pSLC write cache 406 is configured as a ping pong buffer, whereby the memory controller continues to write host data to the pSLC write cache 406 until a write threshold is reached, at which time the memory controller writes a portion of the data written to the pSLC write cache 406 to the multibit NAND media storage area 402, and erases that data from the pSLC write cache 406 in order to maintain sufficient storage space in the pSLC write cache 406 for subsequent writes from the host device.

By configuring the pSLC write cache 406 as a ping pong buffer, the speed of host writes to the pSLC write cache 406 can be maintained. This is because the time to write data to multibit NAND media configured as pSLC NAND media, such as the pSLC write cache 406, is typically much shorter than the time it would take to erase the data. For example, for pSLC write cache 406 configured from TLC NAND media, it only takes 100 μs to program the lower page of the TLC NAND media (which is the only page that is programed in order to operate TLC NAND media as pSLC NAND media), whereas it takes about 10-11 μs to erase just 4 KB of data. Depending on the specific capacity of the TLC NAND media, an erase operation may be in the ms range. By not operating the pSLC write cache 406 as a ping pong buffer, the performance of the SSD 400 will be dramatically reduced as the pSLC 406 write cache will be quickly overwhelmed by writes from the host device.

In one embodiment, the write threshold of the pSLC write cache 406 is determined based on the bandwidth of the host interface between the SSD 400 and the host device and the bandwidth of the multibit NAND media configured as pSLC NAND media. For example, assuming the host interface is a PCIe interface with four PCIe lanes each operating at 8 Gbps, the host interface has a total bandwidth of 32 Gbps, or 4 GBps (32 Gbps/8). Assuming a performance variation tolerance of 20%, the actual speed of the host interface may be about 3.2 GBps. The bandwidth of the pSLC NAND media depends on the type of multibit NAND media used to configure the pSLC NAND media, as well as the specific configuration of the multibit NAND media (i.e. number of die, number of channels, etc.). For example, in a one-die eight-channel configuration using TLC NAND media, pSLC NAND media configured from the TLC NAND media will have write speeds of about 1.4 GBps. Thus, the pSLC write cache 406 has a fill ratio of 2.3×(3.2 GBps/1.4 GBps).

Based on the rate at which the pSLC write cache 406 can be filled by the host device, the write threshold should be greater than the size of the pSLC write cache 406 divided by the fill ratio. Assuming the SSD 400 is the TLC NAND media based SSD with 7% OP having a raw TLC capacity of 1280 GB of Table 1, above, the write threshold is 27 GB (64 GB pSLC write cache/2.3× fill ratio). This means that at any given point in time, at least 27 GB of the pSLC write cache 406 needs to be available to receive writes from the host device. To ensure the pSLC write cache 406 has sufficient space to handle writes from the host device, after the write threshold is exceeded, the data written to the blocks of the pSLC write cache 406 are subjected to error correction parity encoding and moved to the multibit NAND media storage area 402 (denoted by shaded LB-0), and subsequently erased from the pSLC write cache 406.

Figure 5:
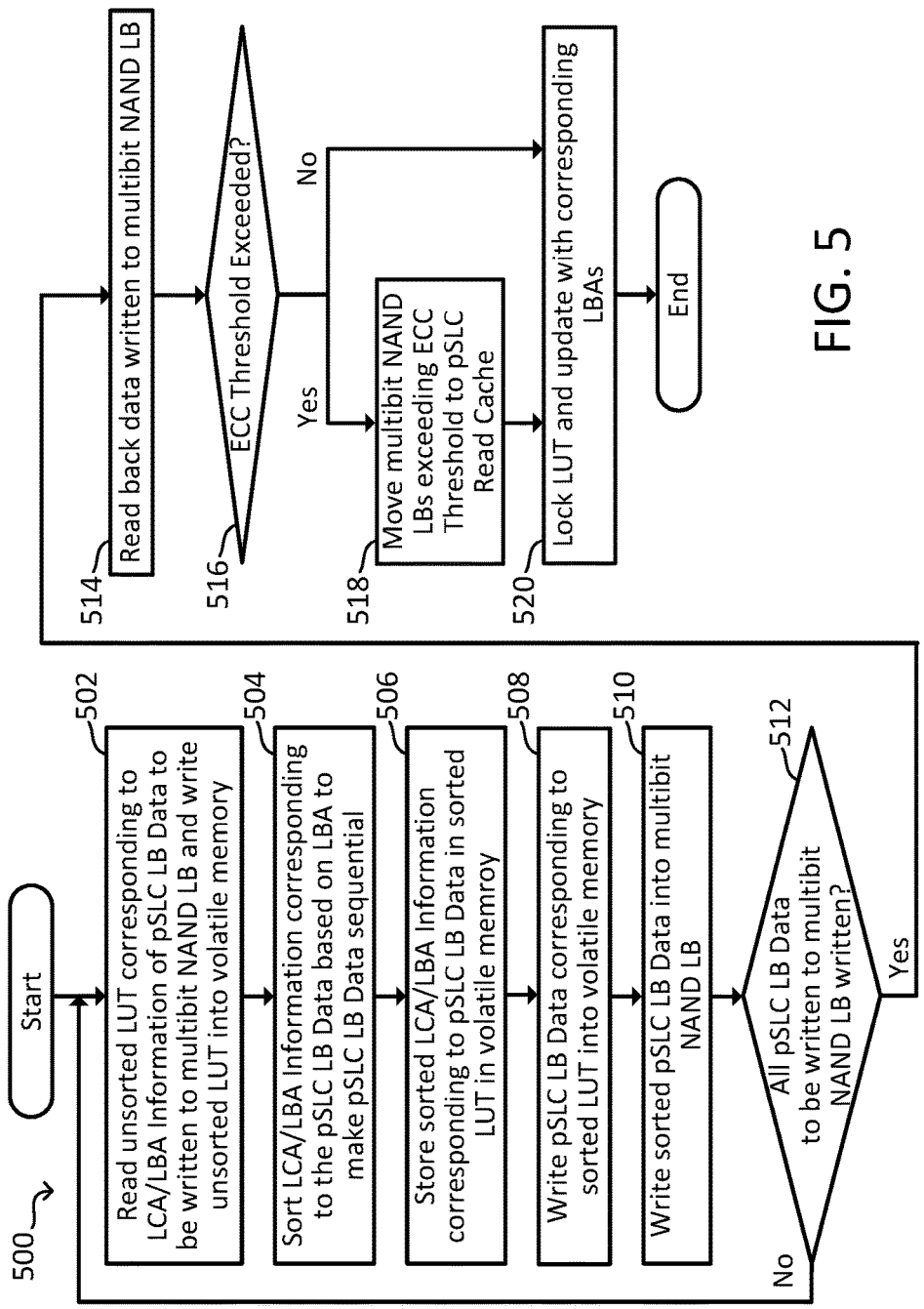
FIG. 5 is a flowchart of steps for sequentially writing data from a pSLC cache to a multibit NAND media, according to one embodiment of the invention.
Figure 6:
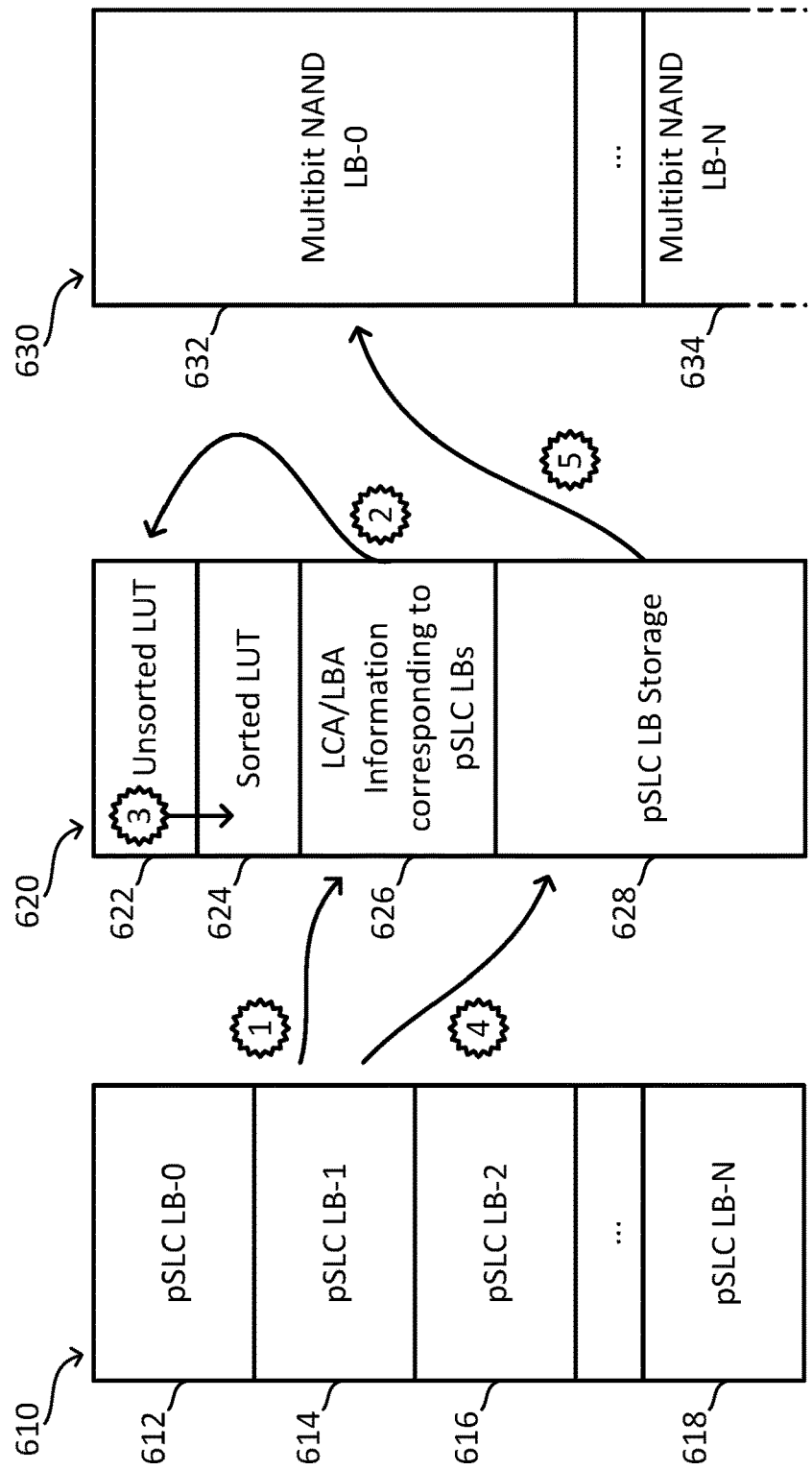
FIG. 6 shows the steps of sequentially writing data from the pSLC cache to the multibit NAND media, according to one embodiment of the invention.

In one embodiment, the memory controller sequentially writes the data from the pSLC write cache 406 to the multibit NAND media storage area 402, as shown in FIGS. 5 and 6, as described in greater detail below. Sequentially writing the data to the multibit NAND media storage area 402 from the pSLC write cache 406 significantly reduces the need to perform garbage collection (at least one order of magnitude), further reducing the maintenance overhead of the SSD 400 and improving performance.

The memory controller subsequently reads back the data written to the physical blocks of the multibit NAND media storage area 402 (i.e. the data previously contained in the physical blocks corresponding to LBs LB-Y+1 to LB of the pSLC write cache 406 that were written to the physical blocks of the multibit NAND media storage area 402 corresponding to LB-0) to determine if the ECC error correction threshold is exceeded. If so, the data in those blocks of the multibit NAND media storage area 402 exceeding the ECC error correction threshold are written to blocks of the pSLC read cache 404 (denoted by the shaded region of LB-X+1). The memory controller marks blocks of the multibit NAND media storage 402 exceeding the ECC error correction threshold as "bad" blocks, similar to bad block management, and the memory controller avoids writing to those "bad" blocks of the multibit NAND media storage area 402 until all other blocks that have not been marked as "bad" blocks have been filled.

Figure 7:
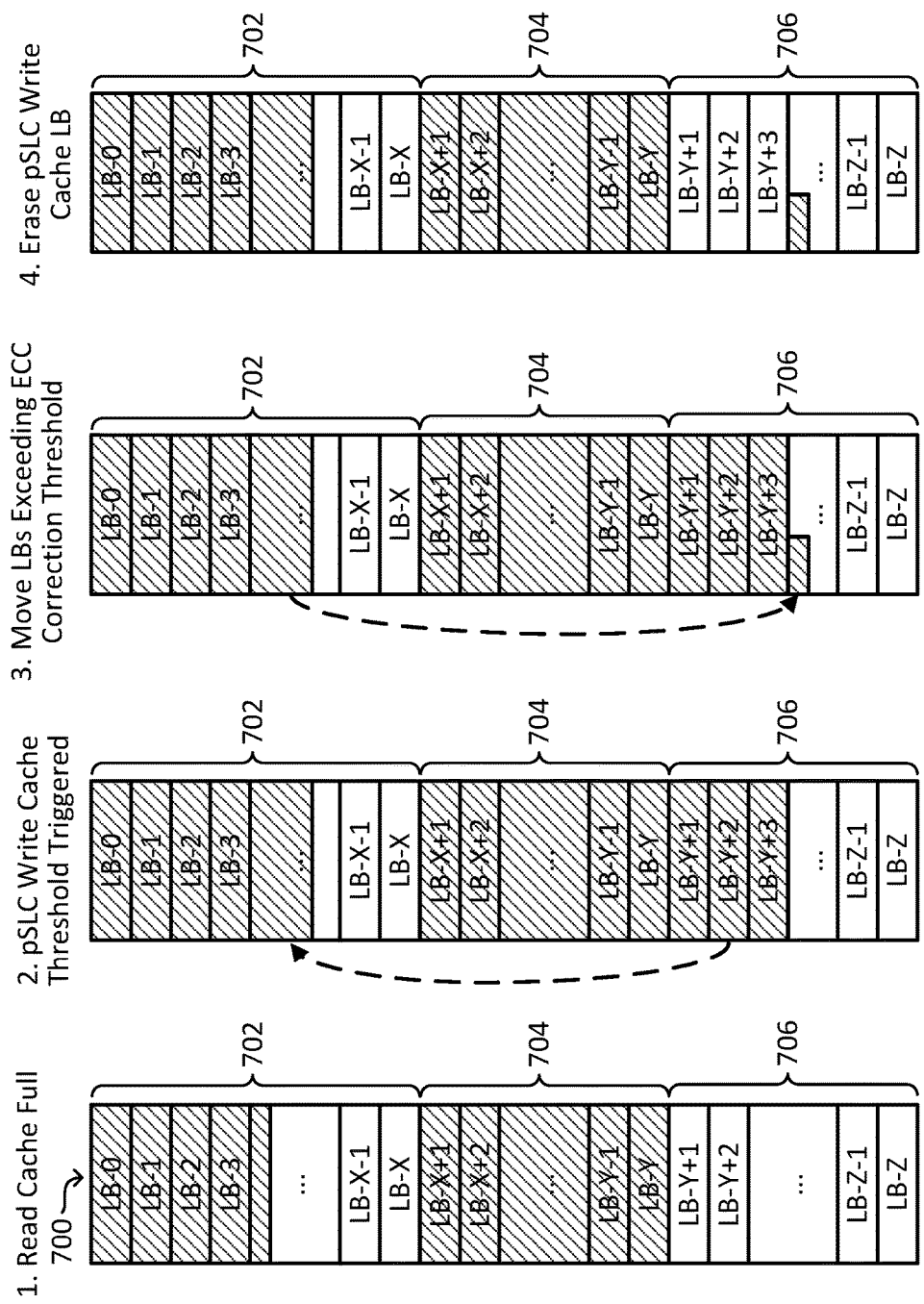
FIG. 7 shows the steps of processing a host write to an SSD with pSLC caching where a pSLC read cache is full, according to one embodiment of the invention.

Once the data is written to the multibit NAND media storage area 402 and the pSLC read cache 404 (if applicable), the memory controller erases the LBs previously storing the data in the pSLC write cache 406. This process continues until the pSLC read cache 406 is full. The processing of a host write to an SSD with pSLC caching where a pSLC read cache is full is illustrated in FIG. 7 and explained in greater detail below.

By processing host writes in the manner shown in FIG. 4, the SSD 400 with pSLC caching realizes a number of benefits over a conventional SSD device without pSLC caching. By initially writing the host data to the pSLC write cache 406 rather than the multibit NAND media storage area 402 (as would have been done in conventional SSDs), the SSD 400 will have speeds similar to as if it were an SLC NAND media based SSD device rather than a multibit NAND media based SSD device. This is because the data does not need to be error correction parity encoded at the time it is written to the pSLC NAND media (rather, the data is error correction parity encoded when it is written to the multibit NAND media) and pSLC NAND media has greatly improved performance speeds as compared to multibit NAND media. For example, the average write time for pSLC NAND media configured from TLC NAND media is about 100 µs, compared with about 3 ms for TLC NAND media. Read times are also improved, with the average read time of pSLC NAND media at about 30 µs, compared with about 80 µs for TLC NAND media. Moreover, with the pSLC write cache 406 configured as a ping pong buffer, the pSLC NAND media speeds of the SSD 400 can be sustained.

Additionally, by writing blocks that exceed the multibit NAND media ECC error correction capabilities (such as exceeding the BCH error correction threshold) to the pSLC read cache 404, the need for using a more robust error correction mechanism such as QSBC for host reads is virtually eliminated, which as previously explained is more time-consuming. This is because pSLC NAND media is much more robust than multibit NAND media, requiring virtually no error correction. Thus, in most instances, data that would have otherwise been subject to time-consuming QSBC error correction and decoding if read from the multibit NAND media, are simply read from the pSLC read cache 404 instead without the need for error correction. Moreover, the data remaining in the multibit NAND media 402 are also confirmed to be correctable using BCH ECC. This means that the read performance of the SSD 400 will be greatly improved because the use of QSBC will be greatly reduced.

The error correction parity encoding and movement of data from the pSLC write cache 406 to the multibit NAND media 402, the read of the data written to the multibit NAND media 402 to check if the ECC threshold has been exceeded, and the subsequent movement of any data in blocks exceeding the ECC threshold to the pSLC read cache 404 may be performed as background operations of the SSD 400 so that the read/write performance of the SSD 400 is not affected when carrying out the process shown and described in FIG. 4. In other words, the steps of processing a host write to an SSD 400 with pSLC caching where a pSLC read cache 404 is transparent to a host device. From the host device's perspective, there will be no appreciable performance difference between the SSD 400 with pSLC caching as compared to a conventional SSD device based on SLC NAND media.

FIG. 5 is a flowchart of method steps 500 for sequentially writing data from a pSLC cache to a multibit NAND media, according to one embodiment of the invention. As previously discussed with respect to FIG. 4, in one embodiment, by sequentially writing data from the pSLC write cache 406 to the multibit NAND media 402 after the write threshold is reached, the need for garbage collection for the SSD 400 is greatly reduced.

To carry out the sequential writing process, at step 502, a memory controller reads one or more look-up tables (LUTs) containing the LCAs and the LBAs (as necessary) corresponding to the data in the pSLC write cache to be moved to the multibit NAND media and writes the one or more LUTs to a volatile memory. In one embodiment, the volatile memory is DRAM. In another embodiment, the volatile memory is SRAM. At step 504, the memory controller sorts the unsorted LUT(s) in the volatile memory such that the LCAs/LBAs corresponding to the data are sequential. At step 506, the memory controller stores the sorted LUT(s) separately from the unsorted LUT(s) in the volatile memory. The memory controller maintains the unsorted LUT(s) in the volatile memory until the data has successfully been sequentially written to the multibit NAND media in the event the SSD encounters an unexpected error or failure event during the sequential writing process.

At step 508, the memory controller writes data from the pSLC write cache to the volatile memory based on the sorted LUT(s) so that the data is stored sequentially in the volatile memory. At step 510, the memory controller writes the sequential data in the volatile memory to the multibit NAND media. At step 512, the memory controller checks to determine if all of the data to be written from the pSLC write cache to the multibit NAND media has been written. If not, steps 502 to 510 are repeated until the memory controller has completed writing all of the data to be written form the pSLC write cache to the multibit NAND media.

Once the memory controller has written all of the data to be written from the pSLC write cache to the multibit NAND media, at step 514, the memory controller reads back the data written to the multibit NAND media to check to see any of the written blocks of data exceed the ECC error correction threshold. If so, at step 518, the memory controller marks the blocks of the multibit NAND media exceeding the ECC error correction threshold as "bad" blocks, and writes the data contained within those "bad" blocks to the pSLC read cache. Once the memory controller has written all of the data contained within the "bad" blocks of the multibit NAND media to the pSLC read cache, or if there were no blocks of the multibit NAND media exceeded the ECC error correction threshold, then at step 520, the memory controller updates the original LUT(s) containing the LCAs/LBAs corresponding to the data originally contained within the pSLC cache with the new LCA/LBA information of the data now written to the multibit NAND media and read pSLC read cache, if any, and locks the LUT(s).

FIG. 6 shows the steps of sequentially writing data from the pSLC write cache 610 to the multibit NAND media 630, according to one embodiment of the invention. As an example, FIG. 6 will be described in connection with the embodiment shown in FIG. 5. As shown in FIG. 6, the pSLC write cache 610 includes a number of LBs pSLC LB-0 612 to pSLC LB-N 618, and the multibit NAND media 630 includes a number of LBs multibit NAND LB-0 632 to multibit NAND LB-N 634. While shown separately, as previously discussed in connection with FIGS. 1, 3, and 4 above, the pSLC write cache 610 and the multibit NAND media 630 are part of the same SSD with pSLC caching (along with OP and pSLC read cache, in one embodiment).

As previously discussed in connection with FIG. 5 above, the sequential write process begins with the memory controller reading the LCA/LBA information corresponding to the data in the pSLC write cache 610 to be written to the multibit NAND media 630. The memory controller writes the LCA/LBA information into a storage area 626 of DRAM 620. The amount of LCA/LBA information the memory controller reads and then writes into the storage area 626 of DRAM 620 depends on the storage density of the multibit NAND media 630. For example, if the multibit NAND media 630 is TLC NAND media, then the memory controller reads three LBs worth of LCA/LBA information (for example, LCA/LBA information corresponding to pSLC LB-0 612 to pSLC LB-2 616) and writes them into the storage area 626 of DRAM 620 as all three pages of TLC NAND media must be written at the same time. In other embodiments where the multibit NAND media 630 is MLC NAND media or QLC NAND media, then the memory controller reads two or four LBs worth of LCA/LBA information and writes them into the DRAM 620, respectively.

Once the memory controller writes the LCA/LBA information into the storage area 626 of the DRAM 620, the memory controller reads the LCA/LBA information of the data to be written from the pSLC write cache 610 to the multibit NAND media 630 and writes that information into an unsorted LUT stored in a storage area 622 of the DRAM 620. The memory controller sequentially sorts the LCA/LBA information in the unsorted LUT within the DRAM 620 and writes the sequentially sorted LCA/LBA information into a sorted LUT stored in a storage area 624 of the DRAM 620. Subsequently, memory controller writes the data in the pSLC LBs of the pSLC write cache 610 into a pSLC LB storage area 628 of the DRAM 620 based on the sequential LCA/LBA information in the sorted LUT.

After the memory controller sequentially writes the data into the pSLC LB storage area 628 of the DRAM 620, the memory controller then writes the sequentially sorted data into a block of the multibit NAND media 630, such as the multibit NAND LB-0 632. As previously discussed in connection with FIGS. 4 and 5, once the memory controller writes data from the pSLC write cache 610 to a block of the multibit NAND media 630, the memory controller reads the data back to determine if the block exceeds the ECC error correction threshold. The memory controller buffers any blocks exceeding the ECC error correction threshold in the DRAM 620 and subsequently writes them to the pSLC read cache (not shown). After the memory controller sequentially writes the data to the multibit NAND media 630, and moves any blocks exceeding the ECC error correction threshold to the pSLC read cache, the memory controller updates the LCA/LBA information of the data now residing in the multibit NAND media and read pSLC cache (if applicable) in the corresponding LUT.

Again, as previously mentioned, by sequentially writing the data from the pSLC write cache 610 to the multibit NAND media 630 the need to perform garbage collection is greatly reduced, thereby reducing the overhead maintenance and processing requirements of the SSD with pSLC caching and improving overall performance. Moreover, the sequential writing of the data from the pSLC write cache 610 to the multibit NAND media 630 may take place in the background of the operation of the SSD with pSLC caching, thereby minimizing any impact on performance of the device due to the sequential writing process.

FIG. 7 shows the steps of processing a host write to an SSD 700 with pSLC caching where a pSLC read cache 704 is full, according to one embodiment of the invention. As shown in FIG. 7, similar to FIG. 4, the SSD 700 with pSLC caching is initially configured into three different storage areas: (1) a multibit NAND media storage area 702 (logical blocks (LB) LB-0 to LB-X) comprising the multibit NAND media data capacity and the OP following the pSLC cache calculation and provisioning shown and described in FIG. 2; (2) a pSLC read cache 704 (LB-X+1 to LB-Y); and (3) a pSLC write cache 706 (LB-Y+1 to LB-Z). As previously discussed, the pSLC read cache 704 and the pSLC write cache 706 are provisioned multibit NAND media configured to operate as pSLC NAND media according to the pSLC cache calculation shown and described in FIG. 2.

During operation, when the pSLC read cache 704 is full (denoted by the shaded LBs LB-X+1 to LB-Y), a memory controller (not shown) of the SSD 700 first stores write data received from a host device coupled to the SSD 700 in physical blocks of the pSLC write cache 706 (denoted by shaded LB's LB-Y+1 to LB-Y+3) similar to when the SSD 700 with pSLC caching receives a write data from the host device when the pSLC read cache 704 is not full as described in connection with FIG. 4, above. Again, the pSLC write cache 706 may be configured as a ping pong buffer. Once the write threshold of the pSLC write cache 706 is exceeded, the memory controller error correction parity encodes a portion of the data written to the pSLC write cache 706 and writes that data to the multibit NAND media storage area 702.

As with the operation of the SSD 400 with pSLC caching of FIG. 4, in one embodiment, the memory controller sequentially writes the data to the multibit NAND media storage area 702. In one embodiment, the memory controller sequentially writes the data in the manner described in connection with FIGS. 5 and 6, above. After the memory controller writes the data to LBs of multibit NAND media storage area 702, the memory controller reads back the data to determine if the ECC error correction threshold has been exceeded.

If any blocks of the multibit NAND media storage area 702 exceed the ECC error correction threshold, the memory controller marks those blocks as "bad" and writes the data contained in those "bad" blocks of the multibit NAND media storage area 702 back to the pSLC write cache 706, rather than to the pSLC read cache 704 as was the case as shown and described in connection with FIG. 4 where the pSLC read cache 404 of the SSD 400 was not full. The memory controller avoids writing to the "bad" blocks in subsequent writes to the multibit NAND media storage area 702 until all other blocks that have not been marked as "bad" blocks have been filled. Once the memory controller writes the data to the multibit NAND media storage area 702 and back to the pSLC write cache 706 (if applicable), the memory controller erases the LBs previously storing the data in the pSLC write cache 706.

Similar to writing the data in the blocks of the multibit NAND media storage area 402 exceeding the ECC error correction threshold to the pSLC read cache 404 as described in FIG. 4, by writing the data in the blocks of the multibit NAND media storage area 702 exceeding the ECC error correction threshold back to the pSLC write cache 706 the SSD 700 will continue to have speeds similar to as if it were an SLC NAND media based SSD device rather than a multibit NAND media based SSD device despite the pSLC read cache 704 being full. Thus, the performance of the SSD 700 with pSLC caching can be maintained by using the pSLC write cache 706 when the pSLC read cache 704 is full. Moreover, because blocks that exceed the multibit NAND media ECC error correction threshold are written to the pSLC write cache 704, there remains virtually no need to use a more time-consuming error correction mechanism such as QSBC for host device reads.

Figure 8:
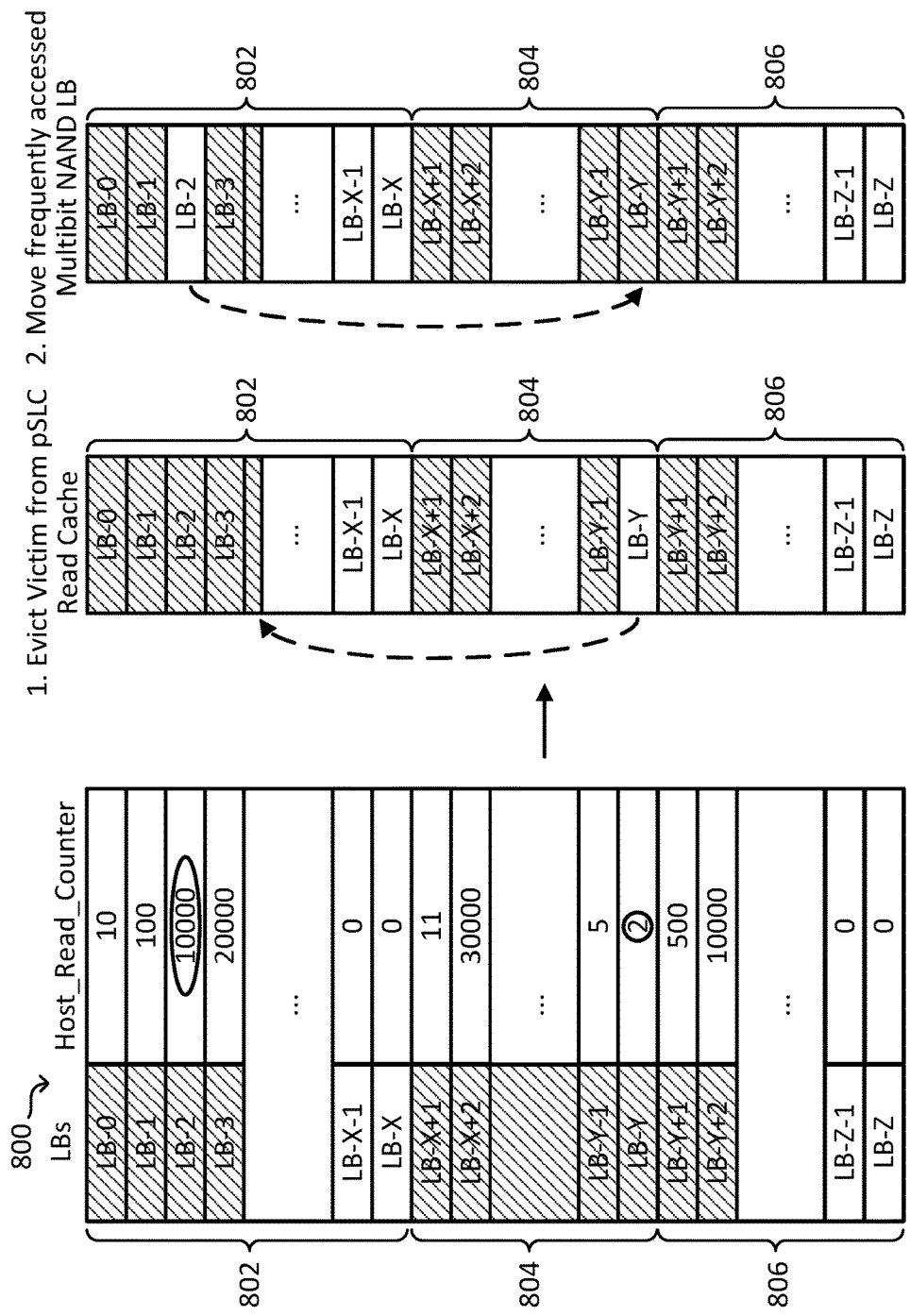
FIG. 8 shows the steps of a pSLC read cache eviction process, according to one embodiment of the invention.

FIG. 8 shows the steps of a pSLC read cache 804 eviction process, according to one embodiment of the invention. As shown in FIG. 8, an SSD 800 with pSLC caching is again configured into three different storage areas: (1) a multibit NAND media storage area 802 (logical blocks (LB) LB-0 to LB-X) comprising the multibit NAND media data capacity and the OP following the pSLC cache calculation and provisioning shown and described in FIG. 2; (2) a pSLC read cache 804 (LB-X+1 to LB-Y); and (3) a pSLC write cache 806 (LB-Y+1 to LB-Z). The SSD 800 also includes a Host_Read_Counter used to maintain statistics on the number of times each LB of the SSD 800 is read or accessed by a host device. The Host_Read_Counter may be stored in a volatile memory of the SSD 800, and may be maintained on a per-boot basis of the SSD 800 to record the number of reads of each particular LB for the lifetime of the boot. At the outset, the Host_Read_Counter for each LB is set to 0 on every boot.

During operation of the SSD 800, as a host device (not shown) connected to the SSD 800 writes data to the SSD 800 (denoted by the shaded LBs of the multibit NAND media storage area 802, the pSLC read cache 804, and the pSLC write cache 806) a memory controller (not shown) of the SSD 800 updates the host read statistics of each LB each time the host device reads from a given LB of the SSD 800. For example, as shown in FIG. 8, LB-0 of the multibit NAND media storage area 802 has been read by the host device 10 times during the current boot lifetime of the SSD 800, LB-0 has been read 100 times, LB-02 has been read 10000 times, and so forth. When the pSLC read cache 804 is full, the memory controller performs an eviction process to evict less frequently accessed (i.e., read) data in the pSLC read cache 804.

As shown in FIG. 8, when the pSLC read cache 804 is full, a patrol operation of the memory controller scans the host read statistics in the Host_Read_Counter to determine the less frequently read data in the pSLC read cache 804 (i.e. the "victim"), such as LB-Y of the pSLC read cache 804 which has only been read by the host device twice during this boot lifetime. The patrol operation similarly identifies the LB s of the multibit NAND media storage area 802 that are read more frequently, such as LB-2 and LB-3 which have 10000 and 20000 host device reads, respectively. The memory controller then swaps the data in the least read LBs of the pSLC read cache 804 with the data in the LBs of the multibit NAND media storage area 802 that are read more frequently.

The memory controller accomplishes this by first writing the data in the least read LBs of the pSLC read cache 804 into free LBs of the pSLC multibit NAND media storage area 802. After the data has been written to the pSLC multibit NAND media storage area 802, the memory controller erases the pSLC read cache 804 LBs, writes the more frequently accessed LBs of the multibit NAND media storage area 802 into the LBs of the pSLC read cache 804 that have been evicted, and erases the data from the LBs of the multibit NAND media storage area 802. In this manner, when full, the pSLC read cache 804 stores only the more frequently accessed LBs out of the LBs comprising the multibit NAND media storage area 802 and the pSLC read cache 804 by evicting those less frequently accessed LBs to the multibit NAND media storage area 802.

The eviction process for the pSLC read cache 804 serves a number of purposes. It frees up limited pSLC storage space in the SSD 800 that, as previously discussed, has superior performance characteristics as compared to the multibit NAND media used to configure the pSLC read cache 804 and the pSLC write cache 806. Thus, by storing more frequently accessed data in the pSLC read cache 804, performance of the SSD 800 will also be improved because there will be a reduced need to perform time-consuming error correction on the data most frequently accessed by the host device because, as previously discussed, pSLC NAND media is much more robust than multibit NAND media and requires virtually no error correction.

Multibit NAND media configured as pSLC NAND media also will have improved P/E characteristics as compared to the multibit NAND media, meaning that the pSLC NAND media will have better endurance and longevity than the multibit NAND media from which it is configured. For example, TLC NAND media is typically specified to have 10,000 P/E cycles, whereas pSLC NAND media configured as TLC NAND media can have 60,000 P/E cycles. Thus, by storing the more frequently accessed data in the pSLC read cache 804, the overall longevity of the SSD 800 can be improved.

Figure 9:
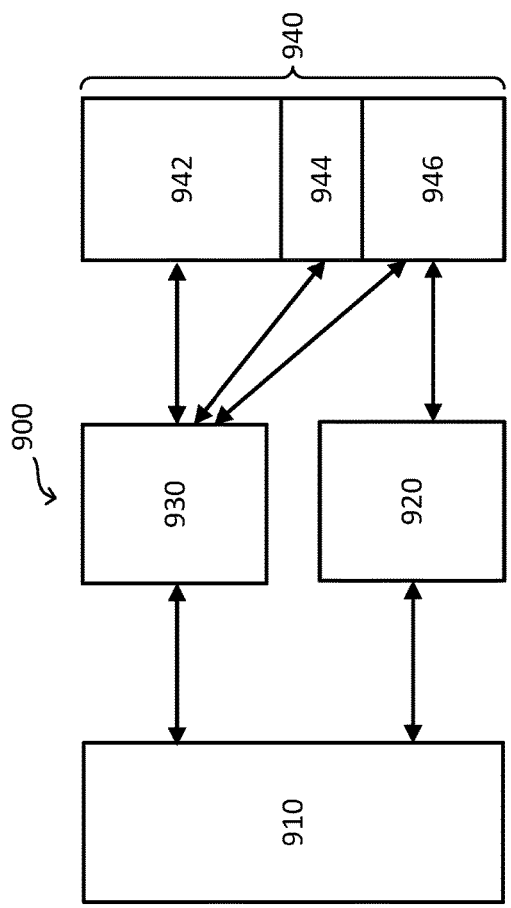
FIG. 9 is a block diagram of a configuration of an SSD with pSLC caching, according to one embodiment of the invention.

FIG. 9 is a block diagram of a configuration of an SSD 900 with pSLC caching, according to one embodiment of the invention. As shown in FIG. 9, the SSD 900 includes a memory controller 910 that is communicatively coupled to volatile memory buffers 920 and 930. In one embodiment, volatile memory buffer 920 is an SRAM device and volatile memory buffer 930 is a DRAM device. The volatile memory buffers 920 and 930 are communicatively coupled to an array of multibit NAND media 940 configured as a multibit NAND media storage area 942, a pSLC read cache 944, and a pSLC write cache 946.

During operation of the SSD 900, the memory controller 910 buffers host writes in volatile memory buffer 920 (i.e. SRAM), and without performing error correction parity encoding, writes the host write data to the pSLC write cache 946. As previously discussed, the pSLC write cache 946 may be configured as a ping pong buffer. Once a write threshold of the pSLC write cache 946 is exceeded, the memory controller 910 buffers blocks of write data from the pSLC write cache 946 in volatile memory buffer 930 (i.e. DRAM), and writes the write data to the multibit NAND media storage area 942 as shown and described in FIGS. 4 and 7. In one embodiment, the memory controller 910 performs an in-memory sorting in the volatile memory buffer 930 of the LCAs/LBAs corresponding to the data blocks to be written to the multibit NAND media storage area 942 in order to sequentially write the data to the multibit NAND media storage area 942 as shown and described in FIGS. 5 and 6.

After reading back the blocks of data written to the multibit NAND media storage area 942, the memory controller 910 marks any blocks exceeding the ECC error correction threshold as "bad" blocks, buffers the data contained in those "bad" blocks back into the volatile memory buffer 930, and writes the data to the pSLC read cache 944 if the pSLC read cache 944 is not full and to the pSLC write cache 946 if the pSLC read cache 944 is full, as previously shown and described in FIGS. 4 and 7. When the pSLC read cache 944 is full, the memory controller 910 performs an eviction process to swap less frequently accessed blocks of data from the pSLC read cache 944 with more frequently accessed blocks of data from the multibit NAND media storage area 942, as previously shown and described in FIG. 8. The volatile memory buffer 930 may be used to buffer the data of the blocks being swapped during the eviction process. The volatile memory buffer 930 may also store host read statistics for the blocks of the pSLC read cache 944 and multibit NAND media storage area 942 for the eviction process.

Figure 10:
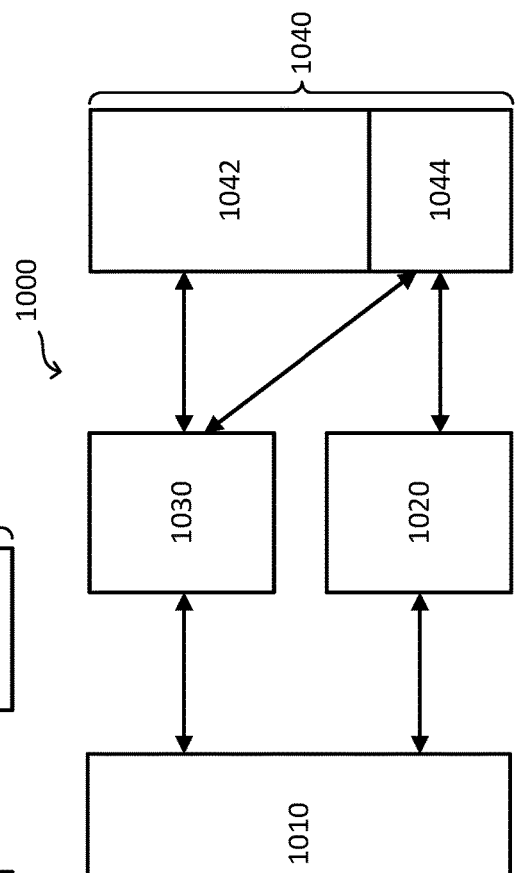
FIG. 10 is a block diagram of a configuration of an SSD with pSLC caching, according to another embodiment of the invention.

FIG. 10 is a block diagram of a configuration of an SSD 1000 with pSLC caching, according to another embodiment of the invention. Similar to the SSD 900 of FIG. 9, the SSD 1000 includes a memory controller 1010 that is communicatively coupled to volatile memory buffers 1020 and 1030. In one embodiment volatile memory buffer 1020 is an SRAM device and volatile memory buffer 1030 is a DRAM device. The volatile memory buffers 1020 and 1030 are communicatively coupled to an array of multibit NAND media 1040 configured as a multibit NAND media storage area 1042, a pSLC write cache 1044.

Instead of further configuring multibit NAND media 1040 to include a pSLC read cache, such as the pSLC read cache 944 as shown in FIG. 9, the SSD 1000 uses a portion of the storage area of the volatile memory buffer 1030 as a read cache. The read cache area of the volatile memory buffer 1030 may be configured to operate in a similar manner as a pSLC read cache, as explained in greater detail below. The amount of storage space of the volatile memory buffer 1030 to be allocated as the read cache may vary depending on a number of considerations, including the overall storage capacity of the SSD 1000 and the desired performance and longevity of the SSD 1000. For example, where the SSD 1000 has a storage capacity of 1 TB, 256 MB of the volatile memory buffer 1030 may be allocated as a read cache.

During operation of the SSD 1000, the memory controller 1010 buffers host writes in volatile memory buffer 1020 (i.e. SRAM), and without performing error correction parity encoding, writes the host write data to the pSLC write cache 1044. Like the pSLC write cache 946 of the SSD 900 shown in FIG. 9, the pSLC write cache 1044 may be configured as a ping pong buffer. Once a write threshold of the pSLC write cache 1044 is exceeded, the memory controller 1010 buffers blocks of write data from the pSLC write cache 1044 in volatile memory buffer 1030 and writes the write data to the multibit NAND media storage area 1042 as shown and described in FIGS. 4 and 7. In one embodiment, the memory controller 1010 performs an in-memory sorting in the volatile memory buffer 1030 of the LCAs/LBAs corresponding to the data blocks to be written to the multibit NAND media storage area 1042 in order to sequentially write the data to the multibit NAND media storage area 1042 as shown and described in FIGS. 5 and 6.

After reading back the blocks of data written to the multibit NAND media storage area 1042, the memory controller 1010 marks any blocks exceeding the ECC error correction threshold as "bad" blocks in the multibit NAND media storage area 1042, buffers the data contained in those "bad" blocks back into the volatile memory buffer 1030, and writes the data into the read cache area of the volatile memory buffer 1030 if it is not full and into the pSLC write cache 1044 if the read cache area of the volatile memory buffer 1030 is full.

As with the pSLC read cache, when the read cache area of the volatile memory buffer 1030 is full, the memory controller 1010 may perform an eviction process to swap less frequently accessed blocks of data from the read cache area of the volatile memory buffer 1030 with more frequently accessed blocks of data from the multibit NAND media storage area 1042, similar to the eviction process shown and described in FIG. 8. The volatile memory buffer 1030 may be used to buffer the data of the blocks being swapped during the eviction process. The volatile memory buffer 1030 may also store host read statistics for the blocks of the read cache area of the volatile memory buffer 1030 and multibit NAND media storage area 1042 for the eviction process.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention.

What is claimed is:

1. A solid state drive (SSD) comprising:
a memory controller;
a plurality of multibit NAND media devices arranged in one or more channels communicatively coupled to the memory controller;
one or more volatile memory devices communicatively coupled to the memory controller; and
a host interface communicatively coupled to the memory controller, wherein
a first portion of the plurality of multibit NAND media devices is configured to operate as a pseudo-single-level cell (pSLC) cache,
a second portion of the plurality of multibit NAND media devices is configured to operate as a multibit NAND media storage area, and
the memory controller is configured to:
write data received via the host interface to one or more blocks of the pSLC cache, transfer data from the one or more blocks of the pSLC cache to one or more blocks of the multibit NAND media storage area, read the data transferred to the multibit NAND media storage area and determine if an error correction code (ECC) error correction threshold has been exceeded for the data read, and when the data read has been determined to exceed the ECC error correction threshold, write such data to the pSLC cache.

2. The SSD of claim 1, wherein the pSLC cache comprises a first area for a pSLC write cache and a second area for a pSLC read cache, the memory controller is configured to:

write data received via the host interface to one or more blocks of the pSLC write cache, transfer data from the pSLC write cache to the multibit NAND media storage area, and for the data transferred to the multibit NAND media storage area that exceeds the ECC error correction threshold, write such data to the pSLC read cache when the pSLC read cache is not full, and write such data to the pSLC write cache when the pSLC read cache is full.

3. The SSD of claim 1, wherein a storage capacity of the pSLC cache is a sum of an initial storage capacity and a series of iterative storage capacities, wherein the initial storage capacity is equal to a result of dividing a storage capacity that remains when a specified user data storage capacity and an overprovisioning (OP) storage capacity are subtracted from a total storage capacity of the plurality of multibit NAND media devices by a storage density of the multibit NAND media devices, a first iterative storage capacity of the series of iterative storage capacities is equal to the initial storage capacity divided by the storage density of the multibit NAND media devices, and each subsequent iterative storage capacity of the series of iterative storage capacities is equal to an immediately preceding iterative storage capacity divided by the storage density of the multibit NAND media devices, whereby a last iterative storage capacity of the series is less than a write flush threshold value.

4. The SSD of claim 2, wherein a storage capacity of the pSLC write cache is equal to a result of multiplying a specified number of drive writes per day (N-DWPD) of the multibit NAND media devices, a specified number of years of operation of the multibit NAND media devices, 365 days, and a specified user data storage capacity, and dividing the result by a specified number of program/erase (PE) cycles of a block of the multibit NAND media devices, and a storage capacity of the pSLC read cache is equal to a difference of a storage capacity of the pSLC cache and the storage capacity of the pSLC write cache.

5. The SSD of claim 2, wherein the memory controller is configured to write data contained in the one or more blocks of the pSLC write cache to the multibit NAND media storage area after a write threshold of the pSLC write cache has been exceeded.

6. The SSD of claim 1, wherein the memory controller is further configured to sequentially write the data contained in the one or more blocks of the pSLC cache to one or more blocks of the multibit NAND media storage area.

7. The SSD of claim 6, wherein the memory controller is configured to perform an in-memory sorting within the one or more volatile memory devices of at least one of a set of logical block addresses (LBAs) and a set of logical cluster addresses (LCAs) corresponding to the data contained in the one or more blocks of the pSLC cache to be written to one or more blocks of the multibit NAND media storage area.

8. The SSD of claim 1, wherein the memory controller is further configured to mark blocks of the multibit NAND media storage area exceeding the ECC error correction threshold as bad blocks, and write data to the bad blocks only when all other blocks of the multibit NAND media storage area that have not been marked as bad blocks have been occupied with data.

9. The SSD of claim 2, wherein the memory controller is further configured to:

collect host read statistics for each one of the one or more blocks of the pSLC read cache and multibit NAND media storage area, and perform an eviction process when the pSLC read cache is full, the eviction process comprising:

the memory controller identifies one or more blocks of the multibit NAND media storage area that have a greater number of host reads than one or more blocks of the pSLC read cache, and the memory controller swaps data contained in the one or more blocks of the multibit NAND media storage area having the greater number of host reads with data contained in the one or more blocks of the pSLC read cache having a fewer number of host reads.

10. The SSD of claim 1, wherein the plurality of multibit NAND media devices are multi-level cell (MLC) NAND media devices, triple-level cell (TLC) NAND media devices, or quad-level cell (QLC) NAND media devices.

11. A method of caching data in an solid state drive (SSD) having a plurality of multibit NAND media devices, the method comprising:

configuring a first portion of the plurality of multibit NAND media devices to operate as a pseudo-single-level cell (pSLC) cache;

configuring a second portion of the plurality of multibit NAND media devices to operate as a multibit NAND storage area;

receiving data from a host device connected to the SSD;

writing the data to one or more blocks of the pSLC cache;

transferring data from the one or more blocks of the pSLC cache to one or more blocks of the multibit NAND media storage area;

reading the data transferred to the multibit NAND media storage area;

determining if an error correction code (ECC) error correction threshold has been exceeded for the data read; and for the data read exceeding the ECC error correction threshold, writing such data to the pSLC cache.

12. The method of claim 11, further comprising:

configuring the pSLC cache into a pSLC write cache and a pSLC read cache;

writing data received from the host device to one or more blocks of the pSLC write cache;

transferring the data contained in the one or more blocks of the pSLC cache to the multibit NAND media storage area; and for the data transferred to the multibit NAND media storage area that exceeds the ECC error correction threshold, writing such data to the pSLC read cache when the pSLC read cache is not full, and writing such data to the pSLC write cache when the pSLC read cache is full.

13. The method of claim 11, wherein the step of configuring the portion of the plurality of multibit NAND media devices to operate as a pseudo-single-level cell (pSLC) cache includes calculating a storage capacity of the pSLC cache that is a sum of an initial storage capacity and a series of iterative storage capacities, wherein the initial storage capacity is equal to a result of dividing a storage capacity that remains when a specified user data storage capacity and an overprovisioning (OP) storage capacity are subtracted from a total storage capacity of the plurality of multibit NAND media devices by a storage density of the multibit NAND media devices, a first iterative storage capacity of the series of iterative storage capacities is equal to the initial storage capacity divided by the storage density of the multibit NAND media devices, and each subsequent iterative storage capacity of the series of iterative storage capacities is equal to an immediately preceding iterative storage capacity divided by the storage density of the multibit NAND media devices, whereby a last iterative storage capacity of the series is less than a write flush threshold value.

14. The method of claim 12, wherein the step of configuring the pSLC cache into the pSLC write cache and the pSLC read cache includes calculating a storage capacity of the pSLC write cache and a storage capacity of the pSLC read cache, wherein the storage capacity of the pSLC write cache is equal to a result of multiplying a specified number of drive writes per day (N-DWPD) of the multibit NAND media devices, a specified number of years of operation of the multibit NAND media devices, 365 days, and a specified user data storage capacity, and dividing the result by a specified number of program/erase (PE) cycles of a block of the multibit NAND media devices, and the storage capacity of the pSLC read cache is equal to a difference of a storage capacity of the pSLC cache and the storage capacity of the pSLC write cache.

15. The method of claim 12, further comprising:
writing data contained in the one or more blocks of the pSLC write cache to the multibit NAND media storage area after a write threshold of the pSLC write cache has been exceeded.

16. The method of claim 11, further comprising:
sequentially writing the data contained in the one or more blocks of the pSLC cache to one or more blocks of the multibit NAND media storage area.

17. The method of claim 16, wherein the step of sequentially writing the data contained in the one or more blocks of the pSLC cache to the one or more blocks of the multibit NAND media storage area includes sorting, in a volatile memory communicatively coupled to the plurality of multibit NAND media devices, at least one of a set of logical block addresses (LBAs) and a set of logical cluster addresses (LCAs) corresponding to the data contained in the one or more blocks of the pSLC cache before writing the data to one or more blocks of the multibit NAND media storage area.

18. The method of claim 11, further comprising:
marking blocks of the multibit NAND media storage area exceeding the ECC error correction threshold as bad blocks, and
writing data to the bad blocks when all other blocks of the multibit NAND media storage area that have not been marked as bad blocks have been occupied with data.

19. The method of claim 12, further comprising:
collecting host read statistics for each one of the one or more blocks of the pSLC read cache and the multibit NAND media storage area; and
performing an eviction process when the pSLC read cache is full, the eviction process comprising:
identifying one or more blocks of the multibit NAND media storage area that have a greater number of host reads than one or more blocks of the pSLC read cache, and
swapping data contained in the one or more blocks of the multibit NAND media storage area having the greater number of host reads with data contained in the one or more blocks of the pSLC read cache having a fewer number of host reads.

20. The method of claim 11, wherein the plurality of NAND media devices are multi-level cell (MLC) NAND media devices, triple-level cell (TLC) NAND media devices, or quad-level cell (QLC) NAND media devices.

* * * * *